US008921824B2

(12) United States Patent
Shin et al.

(10) Patent No.: US 8,921,824 B2
(45) Date of Patent: Dec. 30, 2014

(54) 3-DIMENSIONAL GRAPHENE STRUCTURE AND PROCESS FOR PREPARING AND TRANSFERRING THE SAME

(75) Inventors: Hyeon-jin Shin, Gyeonggi-do (KR); Jae-young Choi, Gyeonggi-do (KR); Ji-hoon Park, Seoul (KR); Joung-real Ahn, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/437,140

(22) Filed: Apr. 2, 2012

(65) Prior Publication Data
US 2012/0248401 A1 Oct. 4, 2012

(30) Foreign Application Priority Data

Mar. 31, 2011 (KR) .................. 10-2011-0029848

(51) Int. Cl.
*H01L 29/06* (2006.01)
*H01L 21/02* (2006.01)
*C01B 31/04* (2006.01)
*H01L 29/16* (2006.01)
*B82Y 40/00* (2011.01)
*B82Y 30/00* (2011.01)

(52) U.S. Cl.
CPC ...... *H01L 21/02587* (2013.01); *H01L 21/0243* (2013.01); *C01B 31/0461* (2013.01); *H01L 21/02378* (2013.01); *H01L 29/1606* (2013.01); *H01L 29/0657* (2013.01); *H01L 21/0237* (2013.01); *B82Y 40/00* (2013.01); *H01L 21/02658* (2013.01); *B82Y 30/00* (2013.01); *H01L 21/02612* (2013.01); *H01L 21/02491* (2013.01); *H01L 21/02527* (2013.01)
USPC ................ 257/9; 257/E29.009; 257/E21.505; 438/479; 438/484; 438/490

(58) Field of Classification Search
CPC ..................... H01L 21/0237; H01L 21/02378; H01L 21/02491; H01L 21/025727
USPC ............... 428/138, 195.1, 734; 977/842, 734; 257/9, E29.009, E21.505; 438/479, 438/484, 490, 458
See application file for complete search history.

(56) References Cited

U.S. PATENT DOCUMENTS

| 7,619,257 | B2 | 11/2009 | Pfeiffer | |
|---|---|---|---|---|
| 2010/0200839 | A1* | 8/2010 | Okai et al. | ...................... 257/29 |
| 2012/0039344 | A1* | 2/2012 | Kian et al. | ......................... 372/6 |

FOREIGN PATENT DOCUMENTS

CN 101602503 A 12/2009
KR 20090124330 A 12/2009

OTHER PUBLICATIONS

G. K. Dimitrakakis, et al. "pillared graphene: a new 3-D network nanostructure for enahnced hydrogen storage" Nano Lett. 8, 10, 3166-3170, 2008.*

(Continued)

*Primary Examiner* — Mark A Laurenzi
(74) *Attorney, Agent, or Firm* — Harness, Dickey & Pierce, P.L.C.

(57) ABSTRACT

A three-dimensional graphene structure, and methods of manufacturing and transferring the same including forming at least one layer of graphene having a periodically repeated three-dimensional shape. The three-dimensional graphene structure is formed by forming a pattern having a three-dimensional shape on a surface of a substrate, and forming the three-dimensional graphene structure having the three-dimensional shape of the pattern by growing graphene on the substrate on which the pattern is formed. The three-dimensional graphene structure is transferred by injecting a gas between the three-dimensional graphene structure and the substrate, separating the three-dimensional graphene structure from the substrate by bonding the three-dimensional graphene structure to an adhesive support, combining the three-dimensional graphene structure with an insulating substrate, and removing the adhesive support.

9 Claims, 14 Drawing Sheets

(56) References Cited

OTHER PUBLICATIONS

Park, Ji-Hoon et al. "Fabrication and Transfer of Patterned Three-Dimensional Graphene." pp. 1-11.

Li Song, et al., "Transfer Printing of Graphene Using Gold Film," *ACS Nano*, vol. 3, No. 6, pp. 1353-1356 (2009).

Xiaogan Liang, et al., "Graphene Transistors Fabricated via Transfer-Printing in Device Active-Areas on Large Wafer," *Nano Lett.*, vol. 7, No. 12, pp. 3840-3844 (2007).

Xiaogan Liang, et al., "Electrostatic Force Assisted Exfoliation of Prepatterned Few-Layer Graphenes into Device Sites," *Nano Lett.*, vol. 9, No. 1, pp. 467-472 (2009).

* cited by examiner

3-DIMENSIONAL GRAPHENE STRUCTURE AND PROCESS FOR PREPARING AND TRANSFERRING THE SAME

CROSS-REFERENCE TO RELATED APPLICATIONS

This application claims priority to, and the benefit of, under 35 U.S.C. §119(e), Korean Patent Application No. 10-2011-0029848, filed on Mar. 31, 2011, in the Korean Intellectual Property Office, the disclosure of which is incorporated herein by reference in its entirety.

BACKGROUND

1. Field

Example embodiments relate to a three-dimensional graphene structure and methods of manufacturing and transferring the same. Other example embodiments relate to 3-dimensional graphene structures with improved integrity and performance and methods of manufacturing and transferring the same.

2. Description of the Related Art

Graphene is drawing attention as a next-generation material for electronic devices because graphene has high mobility at room temperature. Graphene may be manufactured using various methods (e.g., exfoliation of graphite, epitaxial growth, and chemical vapor deposition).

When applying graphene to a device, various substrates (e.g., an oxide film and a plastic material) are used. Therefore, various methods for transferring manufactured graphene on such a substrate are being developed. However, when applying graphene to a large area device, graphene is damaged during a transferring process. Therefore, such damage needs to be suppressed during a process of transferring graphene.

Planar silicon-based devices have integrity and performance limitations. For overcoming such limitations, three-dimensional devices are being developed. Processes of patterning and transferring graphene have also been limited to a planar structure. Therefore, the development of a graphene-based three-dimensional device, and processes of three-dimensionally patterning and transferring graphene are needed.

SUMMARY

Example embodiments relate to a three-dimensional graphene structure and methods of manufacturing and transferring the same. Other example embodiments relate to 3-dimensional graphene structures with improved integrity and performance and methods of manufacturing and transferring the same.

Provided are three-dimensional graphene structures. Provided are methods of manufacturing three-dimensional graphene structures. Provided are methods of transferring three-dimensional graphene structures.

Additional aspects will be set forth in part in the description which follows and, in part, will be apparent from the description, or may be learned by practice of the presented embodiments.

According to example embodiments, a three-dimensional graphene structure includes at least one layer of graphene having a periodically repeated three-dimensional shape.

The three-dimensional shape may include at least one of a convex part and a concave part shaped in the form of one selected from a hemisphere, a cylinder, and a bowl. The three-dimensional shape may be hollow.

The three-dimensional shape may have a size of about 0.1 μm to about 100 μm, and the three-dimensional shape may have a pitch of about 0.1 μm to about 100 μm.

The three-dimensional shape may have a height or a depth of about 10 nm to about 10 μm.

The graphene may be single-layered or multi-layered.

According to example embodiments, a three-dimensional graphene structure, includes a sheet of graphene having a first set of carbon atoms extending along a first plane, and a second set of carbons extending along a second plane substantially parallel to the first plane. The first set of carbon atoms are bonded to the second set of carbon atoms.

The first set of the carbon atoms may collectively form a non-protruding portion. The second set of the carbon atoms may collectively form a protruding portion. The first plane and the second plane may be different.

The three-dimensional graphene structure may include a plurality of the protruding portions. The non-protruding portion and the plurality of protruding portions may be collectively arranged in a repeating three-dimensional pattern.

According to example embodiments, a method of manufacturing a three-dimensional graphene structure includes forming a pattern having a three-dimensional shape on at least one surface of a substrate, and forming the three-dimensional graphene structure having the three-dimensional shape of the pattern by growing graphene on the substrate on which the pattern is assigned.

The substrate may be a SiC wafer. The graphene may be epitaxial graphene.

The pattern may be obtained by photolithography.

The pattern may be a repetition of at least one of a convex part and a concave part shaped in the form of one selected from a hemisphere, a cylinder, and a bowl. The pattern may be hollow.

Growing the graphene may include performing a heat treatment at a temperature of about 1,000° C. to about 2,000° C. in an inert atmosphere for about one minute to about one hour.

The pattern may be formed on a graphitized catalyst metal on the substrate.

The substrate may be a graphitized catalyst metal.

The method may include supplying a separate carbon source when growing the graphene.

According to example embodiments, a method of transferring a three-dimensional graphene structure includes reducing a connection strength between a three-dimensional graphene structure manufactured as described above and a substrate by injecting a gas therebetween, separating the three-dimensional graphene structure from the substrate by bonding the three-dimensional graphene structure to an adhesive support, combining the three-dimensional graphene structure with an insulating substrate, and removing the adhesive support.

The gas may be hydrogen gas. Injecting the gas may be performed at a temperature of about 600° C. to about 1,200° C. for about one minute to about sixty minutes. A pressure of the gas may be about 500 torr to about 800 torr.

The adhesive support may be a thermal release tape. Adhesion of the adhesive support to the three-dimensional graphene structure may be adjusted by heat.

The insulating substrate may be a silicon oxide film.

According to example embodiments, an electronic device including a three-dimensional graphene structure as described above is provided.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
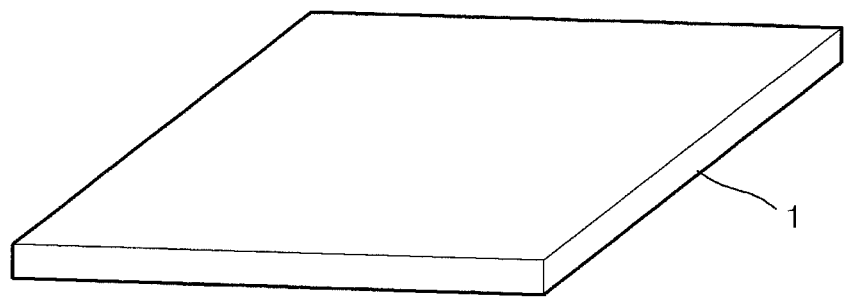
FIG. 1 illustrates a substrate according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a three-dimensional graphene structure and methods of manufacturing and transferring the same. Other example embodiments relate to 3-dimensional graphene structures with improved integrity and performance and methods of manufacturing and transferring the same.

According to example embodiments, a three-dimensional graphene structure having a periodically repeated three-dimensional (3D) shape is provided.

Integrity and performance of various electronic devices may be improved by adopting a three-dimensional graphene structure, and defects that occur during a transferring process may be minimized when working with a three-dimensional structure.

The three-dimensional shape of the three-dimensional graphene structure may vary without limitation. For instance, there may be a periodic bump-like convex (or recessed) part and/or a periodic concave (or protrusion) part forming the three-dimensional shape. These convex and concave parts may have various shapes (e.g., a hemisphere, a cylinder, and a bowl). The various shapes may have inner parts that are empty (or hollow). The convex part or the concave part may be exclusively (or, separately) formed. According to other example embodiments, the convex part or the concave part may be integrally formed.

The three-dimensional shape of the three-dimensional graphene structure may include convex parts and/or concaves parts disposed in a regular arrangement. For instance, concave parts and/or convex parts may be arranged at intervals of about 0.1 μm to about 100 μm, and sizes (e.g., diameters) thereof may range from about 0.1 μm to about 100 μm. Herein, a depth of the concave parts and/or a height of the convex parts may range from about 10 nm to about 10 μm.

The three-dimensional graphene structure may include single-layered graphene, or multilayered graphene. The multilayered graphene may have a thickness of, for example, about 2 layers to about 50 layers.

The three-dimensional graphene structure may be manufactured using a method described below.

Firstly, a three-dimensional pattern is formed on at least one surface of a substrate, and then graphene is grown on the surface on which the pattern is formed to thereby form a three-dimensional graphene structure having a pattern form.

For instance, a SiC substrate (e.g., a SiC wafer) may be used as the substrate. On such a SiC substrate, graphene is epitaxially grown. Graphene may be grown on both silicon and carbon surfaces of a SiC layer. Graphene may be more uniformly grown on a silicon surface than on a carbon surface of a SiC wafer.

A thickness of a SiC layer as an example of the substrate may range from about 1 nm to about 500 μm. In this range, sufficient carbon for growing graphene may be supplied.

For forming a pattern on the substrate (e.g., on a SiC layer), a dry or wet etching process may be used.

Figure 2A:
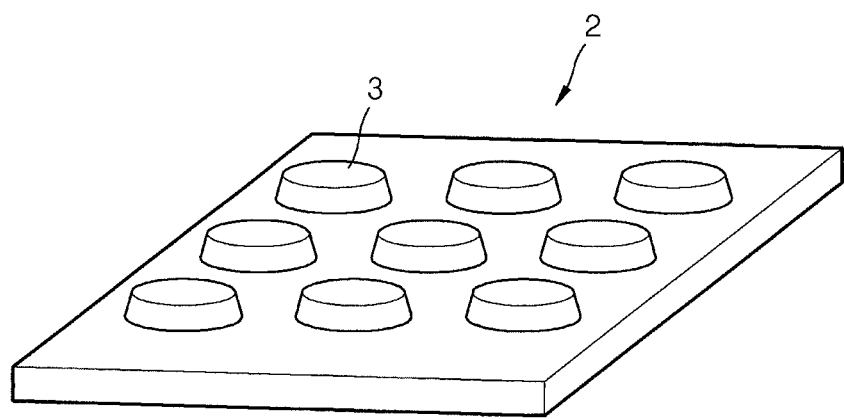
FIGS. 2A and 2B respectively illustrate a substrate where a pattern is formed according to example embodiments and a cross section thereof.
Figure 2B:
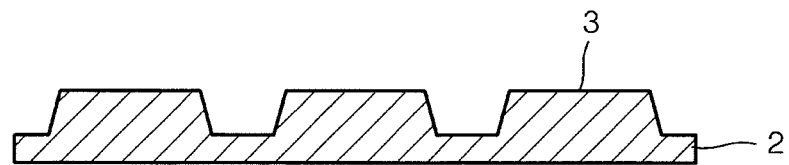

FIG. 1 illustrates a substrate according to example embodiments. FIGS. 2A and 2B respectively illustrate a substrate where a pattern is formed according to example embodiments and a cross section thereof.

Referring to FIGS. 1 and 2A, in the dry etching process, a pattern 3 is formed from a substrate 1 shown in FIG. 1. To this end, a negative photoresist having a set thickness is disposed on the substrate 1, and then a photomask having periodically repeated hole shapes is placed over the photoresist disposed on the substrate 1. Thereafter, a non-exposed region is removed by performing an etching process on an exposed substrate region with a developing solution or a developing gas, and thus the pattern 3 having a convex shape is formed from the substrate 1 so that a substrate 2 having the pattern 3 is obtained.

FIG. 2B illustrates a cross section of the substrate 2 having the pattern 3.

According to other example embodiments, a pattern of concave shapes may also be formed by using a positive photoresist, removing an exposed region, and performing an etching process on an exposed substrate region.

A shape and a pitch of the pattern 3 may be determined according to a photomask used. When circular holes having a diameter of about 0.1 μm to about 100 μm are formed having a pitch of about 0.2 μm to about 100 μm on the photomask, a pattern of an obtained substrate maintains a diameter and a pitch similar, or equal, to the diameter and pitch of the circular holes formed on the photomask. The pitch means a distance between a center of a hole and a center of a neighboring hole.

A height or a depth of the pattern 3 may be appropriately adjusted according to an etching process used. For instance, when using a developing solution, the height or the depth may be adjusted according to the type, the concentration, and/or the soakage time of the developing solution. When using a developing gas, the height or the depth may be adjusted according to the type, the concentration, and/or the reaction time of the developing gas.

Figure 3A:
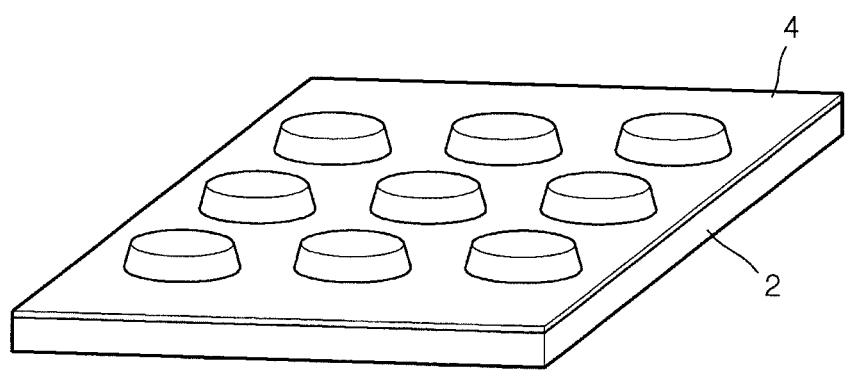
FIGS. 3A and 3B respectively illustrate a substrate where a three-dimensional graphene structure is formed according to example embodiments and a cross section thereof.
Figure 3B:
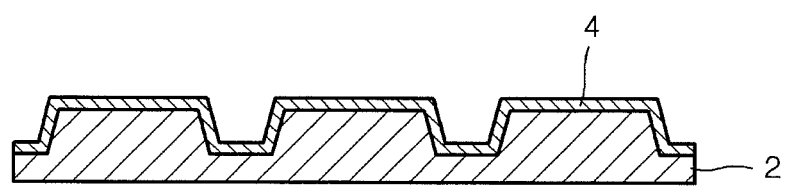

FIGS. 3A and 3B respectively illustrate a substrate where a three-dimensional graphene structure is formed according to example embodiments and a cross section thereof.

Referring to FIGS. 3A and 3B, after the pattern 3 is formed on the substrate 2 as described above, the substrate 2 is heat treated so that a three-dimensional graphene structure 4 may be formed having the shape of the pattern 3.

FIG. 3B illustrates a cross section of the three-dimensional graphene structure formed on the substrate having the shape of the pattern.

When using a substrate including carbon (e.g., a SiC wafer) as the substrate 2, the substrate 2 including carbon serves as a source of carbon, and thus an additional source of carbon is not needed. In this case, bonds of Si—C become weaker due to the heat treatment, and thus carbon is dissociated and moved to a surface and then released. Then, carbon atoms combine with each other to form graphene.

When graphene is formed as, for example, a multilayer structure, epitaxial graphene may be formed. Epitaxial graphene has a structure different from that of naturally-occurring graphene, in which each of graphene layers is rotated by an angle of 60 degrees with respect to a neighboring layer and then stacked to grow graphene, because each of graphene layers of epitaxial graphene may be layered having an independent electron structure. For instance, each of graphene layers of epitaxial graphene may be rotated by an angle of 30 degrees with respect to a neighboring layer.

During the heat treatment for forming the three-dimensional graphene structure 4, the heat treatment may be performed for about one minute to about two hours at a temperature of about 500° C. to about 2,000° C. (e.g., about 1,000° C. to about 2,000° C.) in a vacuum or an inert atmosphere.

An inert atmosphere means that a container is filled with an inert element (e.g., argon or helium). Herein, a pressure may range from about 50 torr to about 1,000 torr (e.g., about 100 torr to about 700 torr).

According to other example embodiments, a three-dimensional graphene structure may be formed using a catalyst metal and a separate source of carbon.

Different from a method of directly forming a pattern on a substrate including carbon, a graphitized catalyst metal may be layered on a substrate and then a pattern may be formed thereon, or a graphitized catalyst metal layer on which a pattern is formed may be layered on a substrate.

Herein, a substrate may be any inorganic substrate (e.g., a Si substrate, a glass substrate, a GaN substrate, and a silica substrate), and/or metal substrates (e.g., a nickel (Ni) substrate, a copper (Cu) substrate, and a tungsten (W) substrate).

A convex layer may be previously applied on a surface of a silica substrate to suppress unnecessary reaction with a graphitized catalyst metal. When a convex layer exists between the substrate and the graphitized catalyst metal, degradation of efficiency of graphene generating due to reaction between the graphitized catalyst and the substrate is suppressed. Materials such as $SiO_x$, TiN, $Al_2O_3$, $TiO_2$, $Si_3N_4$, and BN may be used to form the convex layer, and the convex layer may be formed on the substrate using a sputtering method or the like. A thickness of the convex layer may range from about 0.1 nm to about 1000 μm.

The graphitized catalyst metal contacts a carbon supply source so that carbon components provided from the carbon supply source combine with each other to thereby form a hexagonal planar structure. In this manner, graphite may be synthesized, a carbonization reaction may be induced, or a catalyst used for manufacturing a carbon nanotube may be used. For instance, at least one selected from the group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), thallium (Ta), titanium (Ti), tungsten (W), uranium (U), palladium (Pd), vanadium (V), zirconium (Zr) and combinations thereof may be used. For the graphitized catalyst metal, a planar structure solely composed of such a metal may be used. The graphitized catalyst metal may be deposited on one or more substrates using, for example, a sputtering method to affix the graphitized catalyst metal to the substrate(s).

For patterning the graphitized catalyst metal, a typical method of etching metal may be used, and or any method capable of forming the above-mentioned pattern may be used without limitation.

After forming the graphitized catalyst metal layer on which the pattern is formed on the substrate, a heat treatment is performed thereon while supplying a gaseous carbon source to generate graphene. Then, as the grown graphene is cooled, the three-dimensional graphene structure 4 having the shape of the pattern 3 may be formed. That is, if the patterned graphitized catalyst metal is heat treated for a set time at a set temperature while supplying the gaseous carbon source at a set pressure into a chamber where the patterned graphitized catalyst metal is disposed, carbon components in the gaseous carbon source combine with each other in a hexagonal planar structure to form a three-dimensional graphene structure. If the three-dimensional graphene structure is cooled at a set cooling rate, the three-dimensional graphene structure may be obtained having a uniform arrangement.

During the process of forming the three-dimensional graphene structure 4, carbon may be supplied as the carbon source. Herein, any material which exists in gaseous form at a temperature higher than 300° C. may be used without limitation as the carbon source. A compound including carbon may be used as the gaseous carbon source. For instance, a compound in which the number of carbon is 6 or less (e.g., 4 or less, or 2 or less) may be used. For example, the compound may be at least one selected from the group consisting of carbon monoxide, methane, ethane, ethylene, ethanol, acetylene, propane, propylene, butane, butadiene, pentane, cyclopentadiene, hexane, cyclohexane, benzene, toluene and combinations thereof.

Such a carbon source may be input (or flow) at a constant pressure into an inlet of the chamber where the graphitized catalyst metal is disposed. Within the chamber, only the carbon source, or an inert gas (e.g., helium or argon) and the carbon source may be used.

Also, hydrogen may be used with the gaseous carbon source. Hydrogen may be used to control a gas phase reaction by keeping a surface of a metal catalyst clean. An amount of hydrogen used may be about 5% to 40 vol % (e.g., about 10 to about 30 vol %, or about 15 to about 25 vol %) with respect to a total volume of a container.

After the gaseous carbon source is supplied into the chamber where the graphitized catalyst metal is disposed, a heat treatment is performed thereon to form graphene on a surface of the graphitized catalyst metal. A temperature of the heat treatment may range from about 300° C. to about 2000° C. (e.g., from about 500° C. to about 1500° C.).

When the graphitized catalyst metal is a thick film, the heat treatment may be performed at a higher temperature than when the graphitized catalyst metal is a thin film.

The graphitized catalyst metal may be a thin or thick film. With respect to a thin film, the thin film may be formed on a substrate via a manufacturing process. However, at a temperature higher than about 700° C., a degree of contact between the thin film and the substrate may weaken, and a portion of the thin film may melt. Therefore, when performing a heat treatment at a temperature higher than 700° C., a thick film which does not need a substrate may be used. A thickness of the thin film may range from about 1 to about 1,000 nm (e.g., from about 10 to about 100 nm). A thickness of the thick film may range from about 0.01 to about 5 mm (e.g., from about 0.1 to about 1 mm).

After obtaining the three-dimensional graphene structure 4 as described above, the three-dimensional graphene structure 4 may be transferred onto an insulating substrate. A transferring process means a process of separating the three-dimensional graphene structure 4 grown on the substrate 2, and transferring the separated three-dimensional graphene structure 4 onto another substrate. That is, as described above, graphene grown on the substrate including carbon or the graphitized catalyst metal is transferred onto an insulating film applicable to various devices (e.g., a silicon oxide film).

The transferring process includes reducing a degree of contact between the three-dimensional graphene structure 4 and the substrate 2 by injecting a gas therebetween, separating the three-dimensional graphene structure 4 from the substrate 2 by combining the three-dimensional graphene structure 4 with an adhesive support, and combining the three-dimensional graphene structure 4 with an insulating substrate and removing the adhesive support.

When the three-dimensional graphene structure 4 is forcibly separated during the process of separating the three-dimensional graphene structure 4 from the substrate 2, the three-dimensional graphene structure 4 is damaged due to a connection strength therebetween. Therefore, a process of separating a graphene structure from a substrate without damaging the graphene structure is needed. Accordingly, for reducing the connection strength between the three-dimensional graphene structure 4 and the substrate 2, a gas is injected into a high temperature chamber where the three-dimensional graphene structure 4 and the substrate 2 are disposed.

Figure 4A:
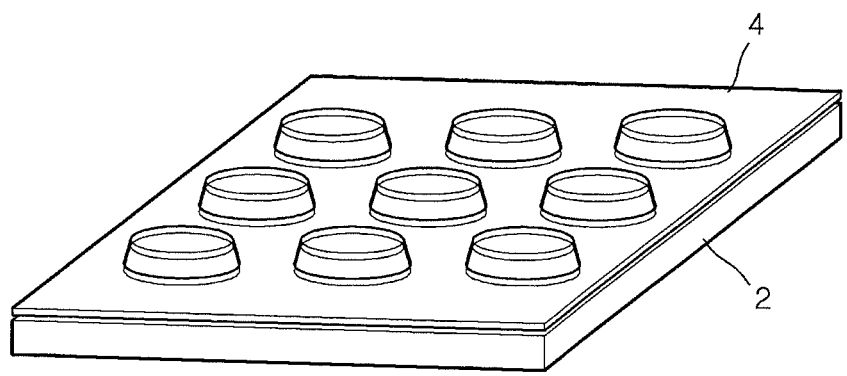
FIGS. 4A and 4B are a schematic diagram and a cross-sectional view illustrating a state in which a gas is injected between a graphene structure and a substrate according to example embodiments.
Figure 4B:
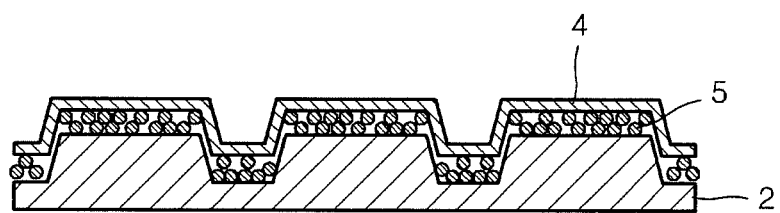

FIGS. 4A and 4B are a schematic diagram and a cross-sectional view illustrating a state in which a gas is injected between a graphene structure and a substrate according to example embodiments.

Referring to FIGS. 4A and 4B, if a high temperature gas is injected, a gas 5 is inserted between the substrate 2 and the three-dimensional graphene structure 4, thereby weakening the connection strength between the substrate 2 and the three-dimensional graphene structure 4.

The gas 5 may be, for example, hydrogen gas. Hydrogen gas may be used at a pressure of about 300 to about 1,000 torr (e.g., about 500 to about 800 torr). Herein, the temperature in the chamber may range from about 500 to about 1,500° C. (e.g., from about 600° C. to about 1,200° C.). The process of injecting gas may be performed for about one minute to about sixty minutes.

Figure 5A:
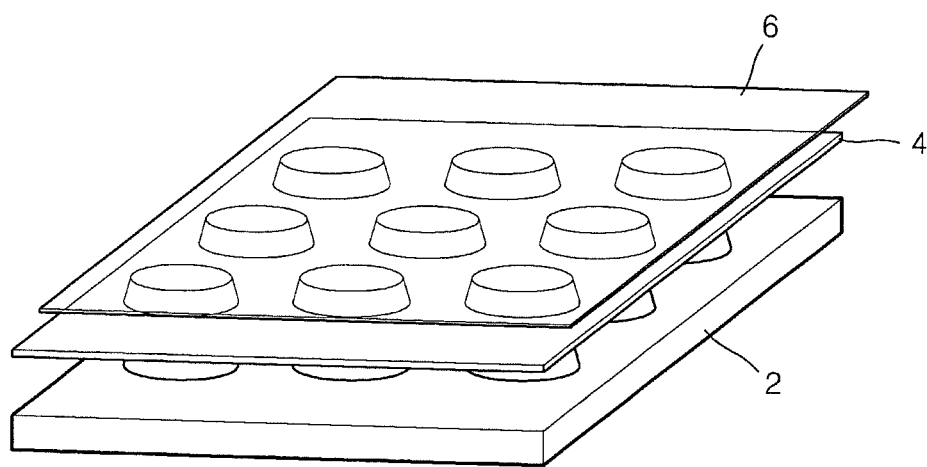
FIGS. 5A and 5B respectively illustrate a substrate on which an adhesive tape is bonded to graphene according to example embodiments and a cross section thereof.
Figure 5B:
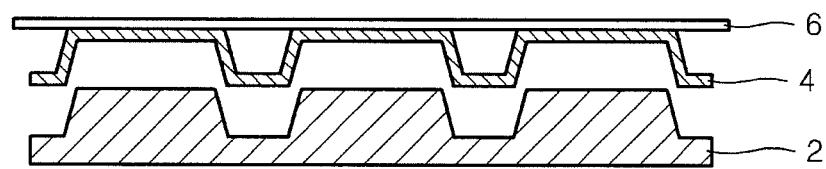

FIGS. 5A and 5B respectively illustrate a substrate on which an adhesive tape is bonded to graphene according to example embodiments and a cross section thereof.

Referring to FIGS. 5A and 5B, when the process of injecting gas is complete, the connection strength between the substrate 2 and the three-dimensional graphene structure 4 is weakened, and thus the three-dimensional graphene structure 4 may be easily separated using an adhesive support 6 (e.g., a tape). Herein, for the tape, an adhesive or cohesive tape may be used. However, the three-dimensional graphene structure 4 should be separated from the adhesive or cohesive tape. Due to the combined strength of the three-dimensional graphene structure 4 and the adhesive or cohesive tape, the three-dimensional graphene structure 4 may be damaged. Therefore, for the adhesive support 6, a thermal release tape or a UV tape may be used. Because the thermal release tape loses its adhesion when its temperature is higher than a certain temperature, the three-dimensional graphene structure 4 may be easily separated from the adhesive support 6 by applying heat.

In the process of combining the adhesive support 6 with the graphene structure 4, the connection strength between the substrate 2 and the graphene structure 4 is weakened. Therefore, it is not necessary to apply a relatively great amount of pressure to bond the adhesive support 6 to the three-dimensional graphene structure 4. Accordingly, an area of the three-dimensional graphene structure 4, which is an object to be transferred, may be greatly increased, and damage to the three-dimensional graphene structure 4 may be minimized (or reduced).

Figure 6A:
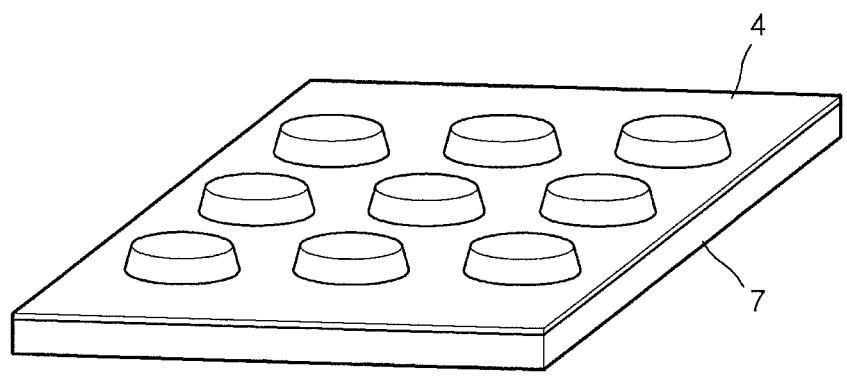
FIGS. 6A and 6B respectively illustrate a three-dimensional graphene structure transferred to an insulating film according to example embodiments and a cross section thereof.
Figure 6B:
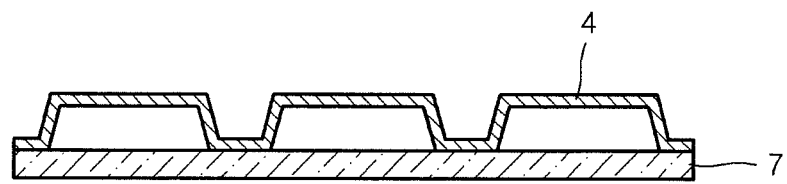

FIGS. 6A and 6B respectively illustrate a three-dimensional graphene structure transferred to an insulating film according to example embodiments and a cross section thereof.

Referring to FIGS. 6A and 6B, the transferring process may be performed by separating the three-dimensional graphene structure 4 from the substrate 2 after inserting the gas 5 using the adhesive support 6 (which may be a thermal release tape), and then transferring the three-dimensional graphene structure 4 onto a targeted insulating substrate 7 and performing a heat treatment thereon to separate the adhesive support 6 from the three-dimensional graphene structure 4.

The three-dimensional graphene structure 4 manufactured as described above may be applied to various electronic devices (e.g., a display device, a transparent electrode for solar cell, a transistor, a sensor, and a channel material of memory).

Hereinafter, example embodiments will be described in reference to the following example.

Example 1

An N-type 6H—SiC (0001) wafer was used as a substrate, and patterning was performed according to a dry etching process described below.

Firstly, a negative photoresist (AZ5214) having a thickness of about 1.4 μm was uniformly applied over a SiC wafer. Thereafter, a photomask (chrome/quartz glass template, about 6 μm dot pattern with about 8 μm pitch) was located on the SiC wafer, and then was exposed to a G-line light source having a wavelength of about 436 nm. Thereafter, an opened area of the SiC wafer was etched by a reactive iron etching method using a mixed gas of $SF_6$/Ar. The etching rate was about 500 Å/minute, and the etching process was performed for about 10 minutes.

Figure 7:
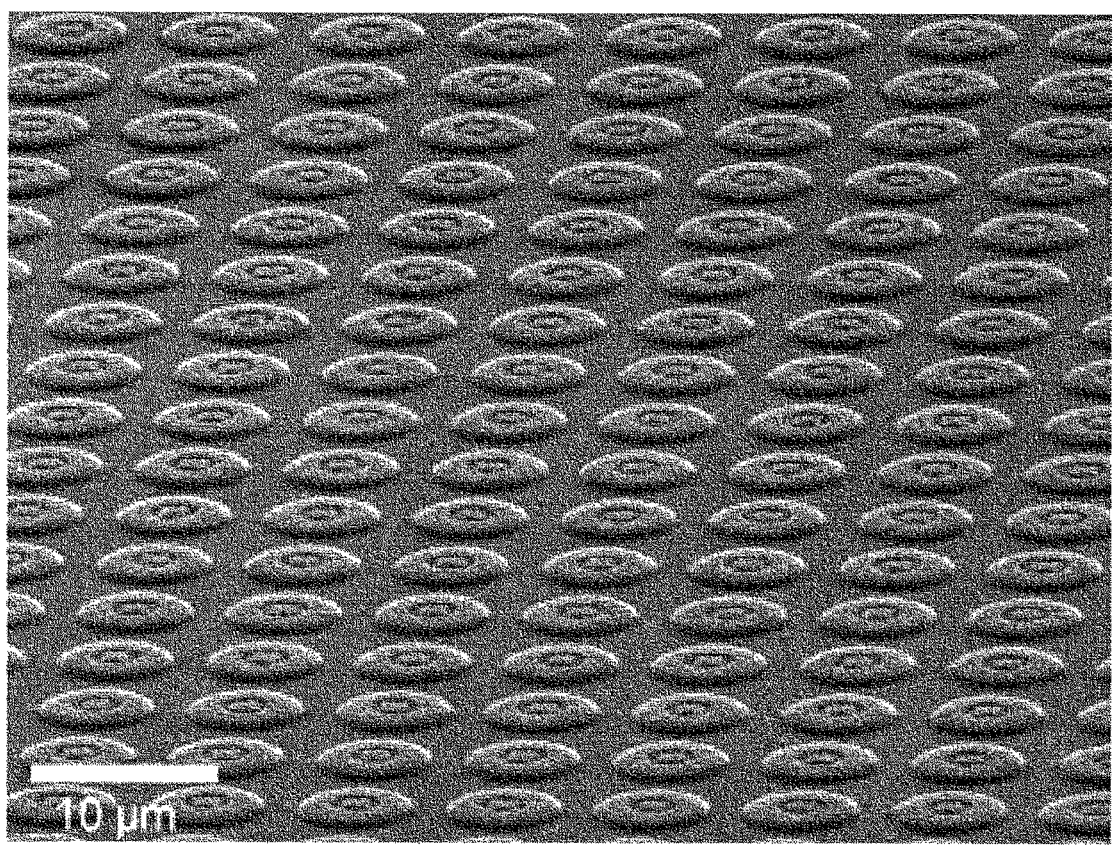
FIG. 7 is an SEM image of a SiC pattern wafer obtained from Example 1.

FIG. 7 is an SEM image of a SiC pattern structure obtained through the dry etching process described in Example 1.

Referring to FIG. 7, the SiC pattern structure had a capsized bowl form, and a diameter and a height of one pattern were respectively about 6 μm and about 0.5 μm. A ring pattern was additionally formed on the capsized-bowl pattern.

Thereafter, the SiC pattern structure was heat treated at a temperature of about 1,650° C. for about 10 minutes in a chamber containing argon of about 680 torr, and then was slowly cooled so that a three-dimensional epitaxial graphene structure was formed to a thickness less than about 1 nm.

Thereafter, hydrogen of about 760 torr was applied into the chamber, and a temperature was kept at about 800 to about 1,000° C. for about 10 minutes to insert hydrogen between the SiC wafer and the graphene structure.

Thereafter, at room temperature, a thermal release tape (REVALPHA, product of Nittodenko Corporation) was bonded to the graphene structure to separate the graphene structure from the SiC wafer. Then, the separated graphene structure was transferred to a silicon oxide film having a thickness of about 300 nm. Adhesion of the thermal release tape was adjusted by the application of heat. When the thermal release tape was heated to a temperature of about 145° C. after the thermal release tape was bonded to the graphene structure on the SiC wafer at room temperature, the graphene structure was separated from the tape.

Figure 8:
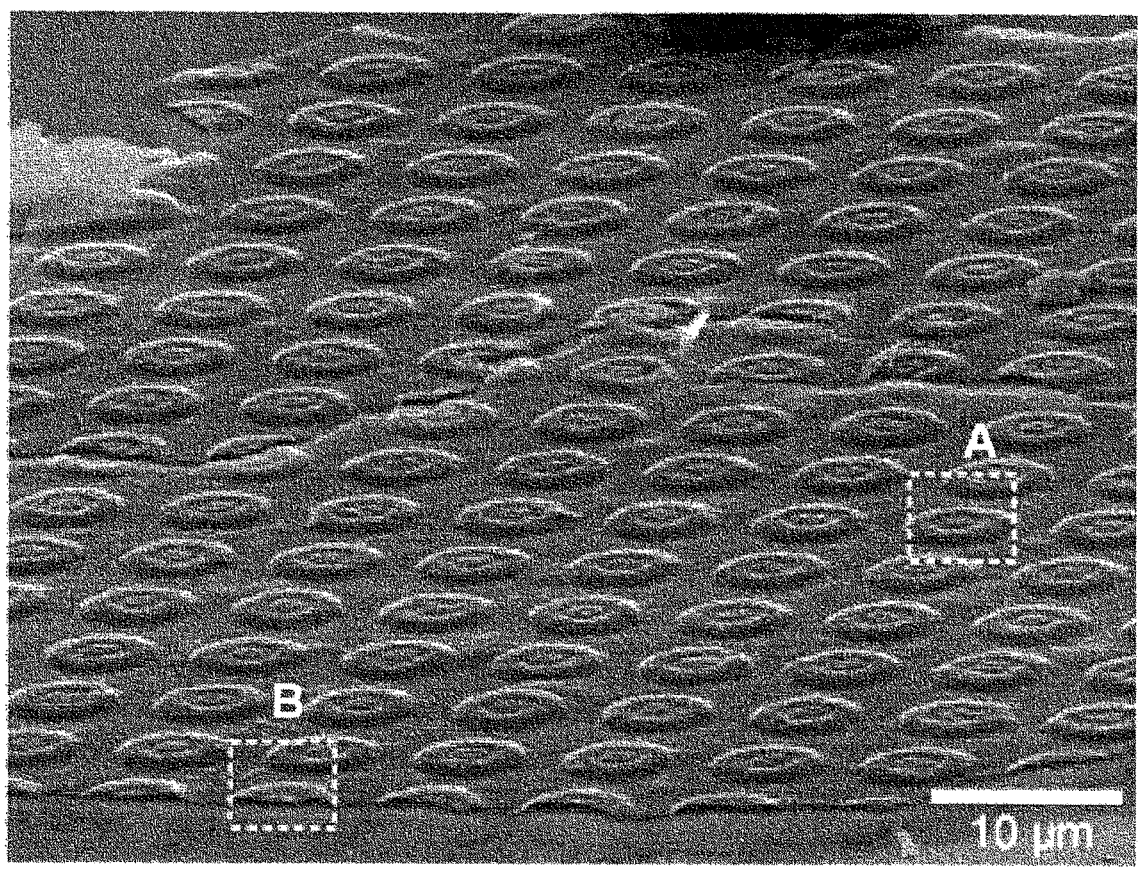
FIG. 8 is an SEM image of a three-dimensional graphene structure transferred to a silicon oxide film.
Figure 9:
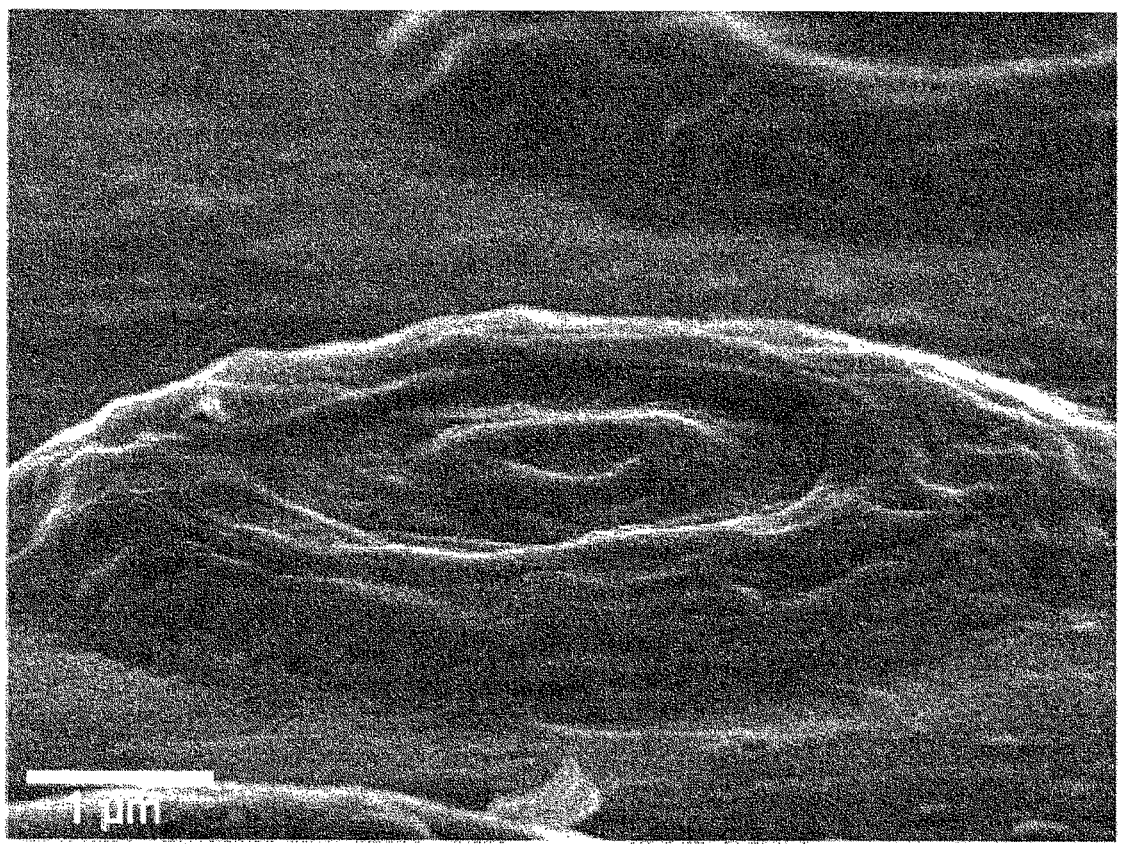
FIG. 9 is a magnified diagram of an area 'A' of FIG. 8.

FIG. 8 is an SEM image of a three-dimensional graphene structure transferred to a silicon oxide film. FIG. 9 is a magnified picture of an 'A' area existing at a center of the three-dimensional graphene structure, and FIG. 10 is a magnified picture of a 'B' area existing at a terminal part of the three-dimensional graphene structure.

Figure 10:
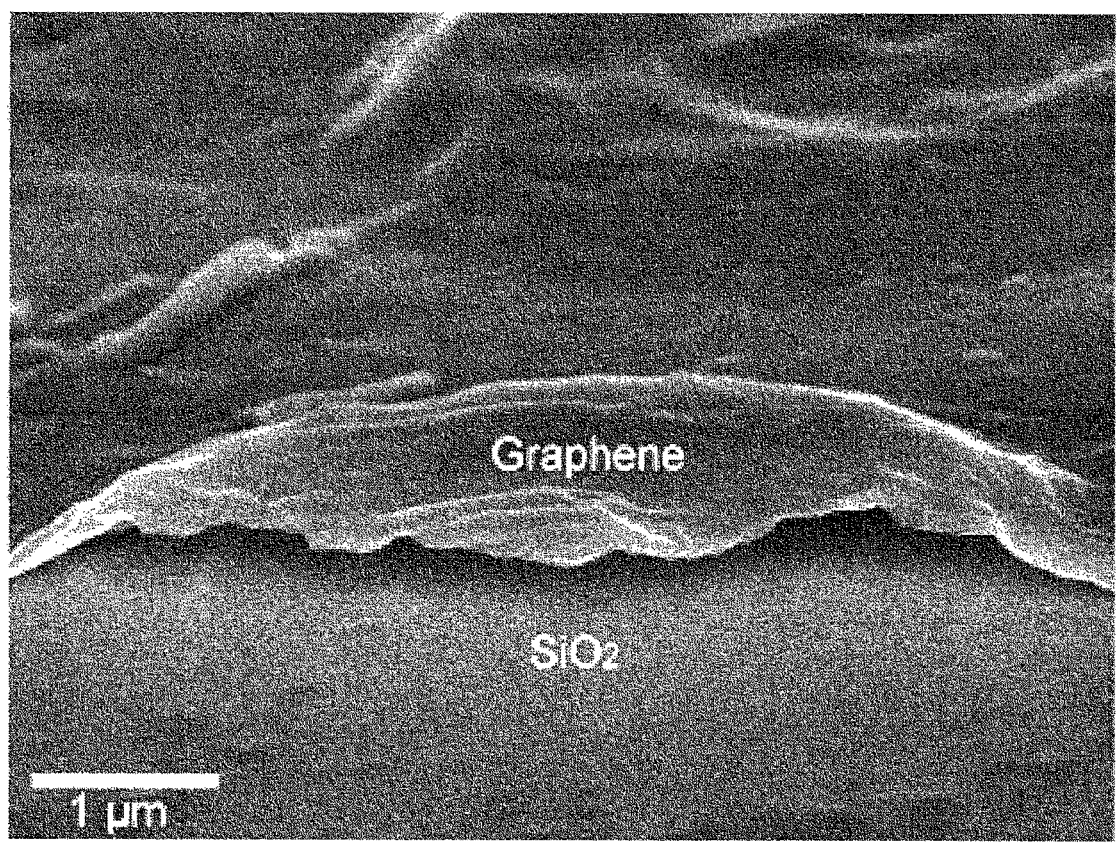
FIG. 10 is a magnified diagram of an area 'B' of FIG. 8.

Referring to FIGS. 8 to 10, the three-dimensional graphene structure has the same capsized bowl shape as the SiC pattern wafer illustrated in FIG. 7. As illustrated in FIG. 10, an inner part of the graphene structure is empty (or hollow). That is, the three-dimensional graphene structure having the capsized bowl shape is partly floating on a silicon oxide film. The partly floating three-dimensional graphene structure is supported by a planar graphene between bowls. Therefore, as illustrated in FIGS. 2 to 5, graphene is three-dimensionally grown on a SiC pattern wafer, and the grown graphene is transferred onto a desired substrate while keeping a three-dimensional structure of the SiC pattern wafer.

Figure 11:
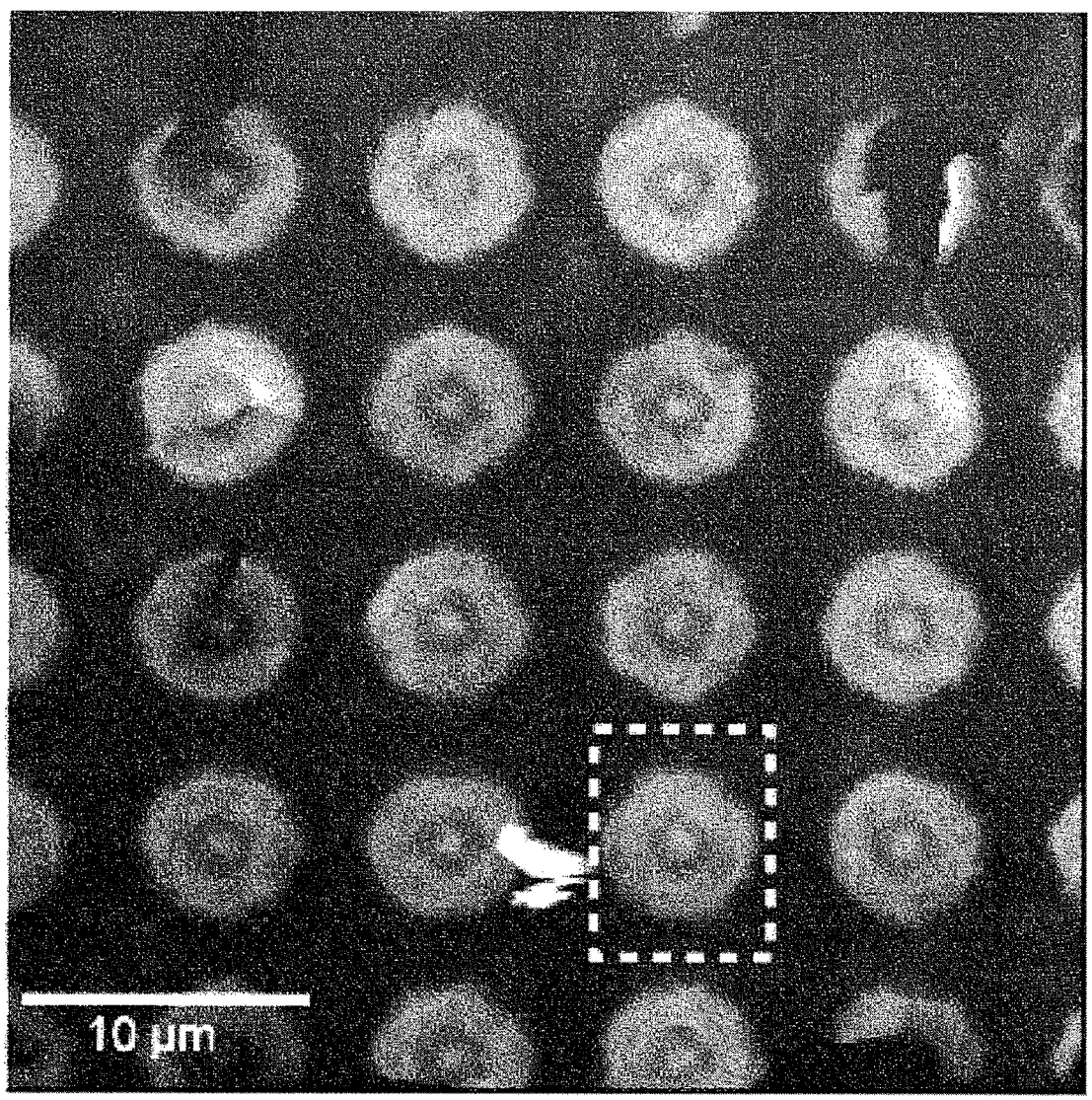
FIG. 11 is an atomic force microscope image of a three-dimensional graphene structure obtained from Example 1.
Figure 12:
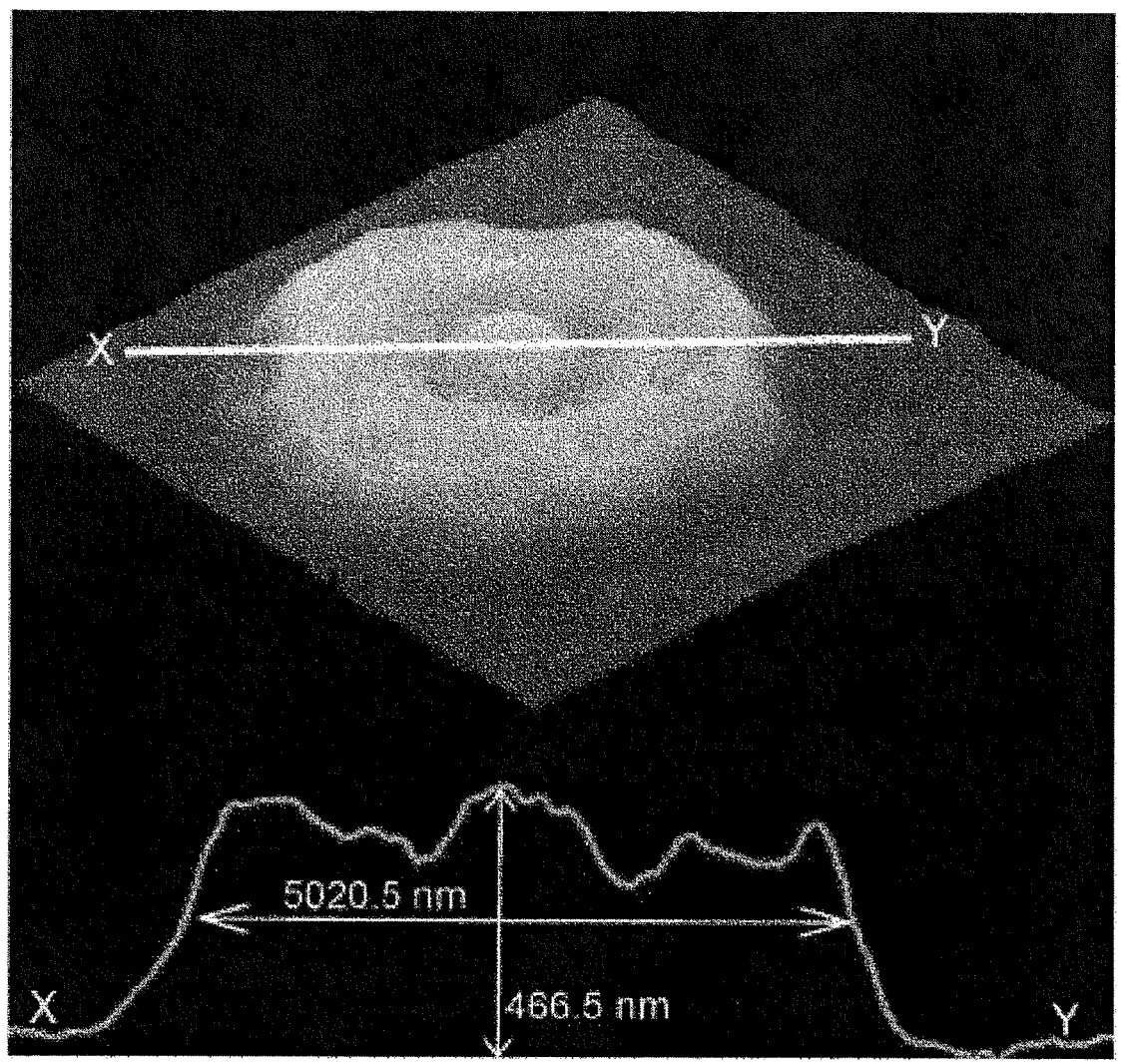
FIG. 12 is a magnified diagram of an area marked by a quadrangle of FIG. 11.

FIG. 11 is an atomic force microscope image of a three-dimensional graphene structure obtained from Example 1. FIG. 12 is a magnified diagram of an area marked by a quadrangle of FIG. 11.

Referring to FIG. 11, a size of a three-dimensional graphene structure having the capsized bowl shape and transferred onto the silicon oxide film is measured using an atomic force microscope.

Referring to FIG. 12, an image of a single pattern is taken by an atomic force microscope. Herein, it is shown that a height and a diameter of the three-dimensional graphene structure are respectively about 466.5 nm and about 5020.5 nm. Such a height and a diameter are similar to those of the pattern of the SiC wafer illustrated in FIG. 7, and a ring shape of the SiC pattern wafer is also observed from the capsized bowl shape.

Figure 13:
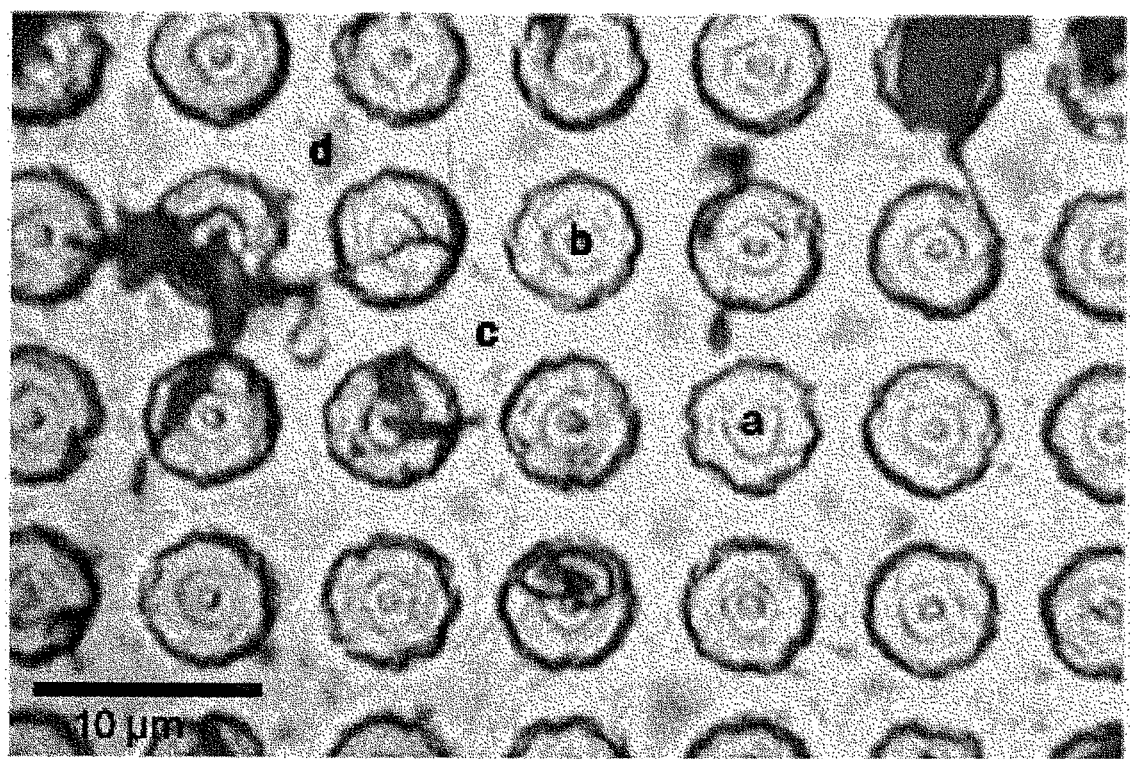
FIG. 13 illustrates a certain area of a three-dimensional graphene structure obtained from Example 1.
Figure 14:
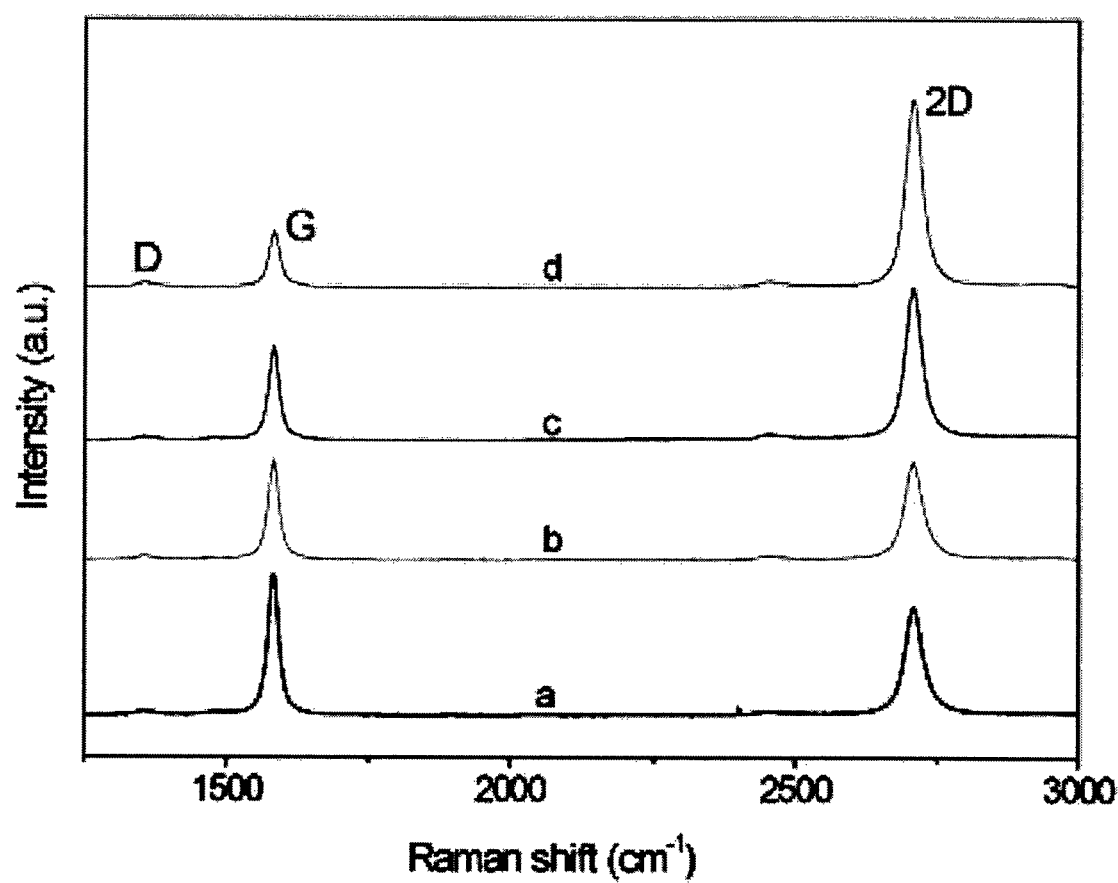
FIG. 14 illustrates a Raman spectrum of areas 'a' to 'd' illustrated in FIG. 13.

FIG. 13 illustrates a certain area of a three-dimensional graphene structure obtained from Example 1. FIG. 14 illustrates a Raman spectrum of areas 'a' to 'd' illustrated in FIG. 13.

Referring to FIG. 14, a Raman spectrum (excitation light: laser of about 514.5 nm) is measured at areas 'a' to 'd' of the three-dimensional graphene transferred to the silicon oxide in FIG. 13.

The Raman spectrum has three major characteristics of about 1350 (D peak), about 1580 (G peak), and about 2700 (2D peak) cm$^{-1}$. It is known that the D peak is originated from graphene damage. Intensity of the D peak measured at various locations is very low in comparison with the G peak and the 2D peak. From this, it may be understood that the transferred three-dimensional graphene structure is very uniform.

A relative intensity of a 2D band to a G band ($I_{2D}/I_G$) is inversely proportional to a number of graphene layers. About 30% of the three-dimensional graphene has $I_{2D}/I_G$ ranging from about 1.5 to about 4.0 on average, and about 60% of the three-dimensional graphene has $I_{2D}/I_G$ ranging from about 0.5 to about 1.5 on average. As already known about the graphene transferred to the silicon oxide, single-layer graphene has $I_{2D}/I_G$ of about 2.5 and double-layer graphene has $I_{2D}/I_G$ of about 1.2. Therefore, it may be understood that most of the three-dimensional graphene structure transferred to the silicon oxide film has a number of layers less than 3.

As described above, according to example embodiments, a three-dimensional graphene structure has a fixed three-dimensional shape, and thus integrity and performance of a device improves. Further, by virtue of such a three-dimensional structure, a process of transferring graphene can be more stable, thereby suppressing damage to graphene.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A three-dimensional graphene structure, comprising:
   at least one layer of graphene, wherein the at least one layer of graphene has a protruding portion and a non-protruding portion, and
   the protruding portion and the non-protruding portion are connected to form a periodically repeated three-dimensional shape, and
   wherein a protruding end of the protruding portion is closed.

2. The three-dimensional graphene structure of claim 1, wherein,
   the protruding portion includes at least one of selected from a convex part and a concave part,
   the convex part and the concave part are shaped in the form of one selected from a hemisphere, a cylinder, and a bowl, and
   an inner part of the protruding portion is hollow.

3. The three-dimensional graphene structure of claim 1, wherein,
   the three-dimensional shape has a size of about 0.1 μm to about 100 μm, and
   the three-dimensional shape has a pitch of about 0.1 μm to about 100 μm.

4. The three-dimensional graphene structure of claim 1, wherein the three-dimensional shape has a height or a depth of about 10 nm to about 10 μm.

5. The three-dimensional graphene structure of claim 1, further comprising a plurality of layers of the graphene.

6. An electronic device, comprising:
   the three-dimensional graphene structure according to claim 1.

7. A three-dimensional graphene structure, comprising:
   a sheet of graphene having a first set of carbon atoms extending along a first plane and a second set of carbons extending along a second plane substantially parallel to the first plane,
   wherein the first set of carbon atoms are bonded to the second set of carbon atoms,
   the sheet of graphene has a protruding portion and a non-protruding portion,
   the protruding portion and the non-protruding portion are connected to form a periodically repeated three-dimensional shape, and
   wherein a protruding end of the protruding portion is closed.

8. The three-dimensional graphene structure of claim 7, wherein,
   the first set of the carbon atoms collectively form the non-protruding portion,
   the second set of the carbon atoms collectively form the protruding portion, and
   the first plane and the second plane are different.

9. The three-dimensional graphene structure of claim 8, further comprising a plurality of the protruding portions.

* * * * *